(12) United States Patent
May

(10) Patent No.: US 12,405,317 B2
(45) Date of Patent: Sep. 2, 2025

(54) LEAK DETECTION DEVICE AND ASSOCIATED ELECTRICAL POWER SUPPLY

(71) Applicant: ATEQ, Les Clayes-sous-bois (FR)

(72) Inventor: Thierry May, Les Clayes-sous-bois (FR)

(73) Assignee: ATEQ, Les Clayes sous Bois (FR)

( * ) Notice: Subject to any disclaimer, the term of this patent is extended or adjusted under 35 U.S.C. 154(b) by 88 days.

(21) Appl. No.: 18/027,750

(22) PCT Filed: Sep. 22, 2021

(86) PCT No.: PCT/EP2021/076057
§ 371 (c)(1),
(2) Date: Mar. 22, 2023

(87) PCT Pub. No.: WO2022/063824
PCT Pub. Date: Mar. 31, 2022

(65) Prior Publication Data
US 2023/0375640 A1    Nov. 23, 2023

(30) Foreign Application Priority Data
Sep. 25, 2020    (FR) ..................................... 2009772

(51) Int. Cl.
*G01R 31/52*    (2020.01)
*G01R 31/14*    (2006.01)
*G01R 31/16*    (2006.01)

(52) U.S. Cl.
CPC ............. *G01R 31/52* (2020.01); *G01R 31/14* (2013.01); *G01R 31/16* (2013.01)

(58) Field of Classification Search
USPC ......................................... 324/551, 714–718
See application file for complete search history.

(56) References Cited

U.S. PATENT DOCUMENTS

| | | | |
|---|---|---|---|
| 10,809,307 B2 | 10/2020 | Brebant et al. | |
| 11,187,752 B2 | 11/2021 | Regef et al. | |
| 2004/0066149 A1 | 4/2004 | Gray | |
| 2010/0073012 A1* | 3/2010 | Inoue | H02K 9/24 |
| | | | 324/551 |
| 2018/0100829 A1 | 4/2018 | Schönhoff et al. | |
| 2018/0287479 A1* | 10/2018 | Li | H02M 3/33523 |

* cited by examiner

*Primary Examiner* — Farhana A Hoque
(74) *Attorney, Agent, or Firm* — Young Basile Hanlon & MacFarlane, P.C.

(57) ABSTRACT

A leak detection device includes a space intended to receive a part to be tested, at least two electrodes disposed on either side of the reception space, a direct-current electrical power supply supplying at least one of the electrodes with an output voltage, and a current detector configured to measure the current generated by the voltage difference between the electrodes. The electrical power supply is a power supply including a transformer having a midpoint primary, a transistor connected to said midpoint of the transformer, switches whose succession of openings and closures has at least one duty cycle and enables the transmission of energy through the transformer, and at least one regulation circuit regulating the value of the duty cycle and the voltage supplying the base of the transistor.

19 Claims, 5 Drawing Sheets

LEAK DETECTION DEVICE AND ASSOCIATED ELECTRICAL POWER SUPPLY

TECHNICAL FIELD

The present invention relates to a device for detecting leaks by highlighting an electrical insulation defect, in particular by measuring an electric current. More particularly, the invention relates to an electrical power supply for such a device.

BACKGROUND

Such a leak detection device is a device allowing the detection of openings, holes, or homogeneity defects in the electrically-insulating portions (such as portions made of dielectric materials) of an object. This type of device finds a particularly advantageous application in the verification of the integrity of electric batteries, such as Lithium-Ion, Lithium-Polymer batteries, etc. Indeed, this type of battery has an electrically-insulating case, generally made of a plastic material (or one of its derivatives), in which a cathode, an anode, and an electrolyte, generally in polymer form, are disposed.

Indeed, as represented in FIG. 1, a leak detection device 1 comprises a space 3 configured to receive the part to be tested 5, such as a battery mentioned hereinabove, electrodes 7 and 9 disposed on either side of the part, an electrical power supply 11 supplying at least one of the electrodes 7, as well as an electric current measuring device 13 configured to measure the current flowing between said electrodes 7 and 9 (for example "through" the part to be tested).

More specifically, one of the electrodes 7, called the injection electrode, is connected to the electrical power supply 11 and is supplied with a predetermined voltage, also referred to as the "test voltage". The other electrode 9, called the reception electrode, is connected to the ground G and has a potential close to zero.

Hence, there is a difference in electric potential between the two electrodes 7 and 9 and the establishment of an electric field that at least partially ionizes the matter, such as the constituent elements of air (for example dioxygen), between the electrodes 7, 9 and the object to be tested 5.

Thus, as represented in FIG. 2, there is ionization of the air, and creation of charge carriers that move under the effect of the electric field. Thus, if the part to be tested 5 has a defect or an opening 5a, the charge carriers then make their way up to the reception electrode 9. In the case where the part to be tested 5 is an electric battery (i.e., electrodes and a reservoir of electrolytes surrounded by a layer of an electrical insulator), and if the battery has a defect at its insulating layer, part of the electrolyte is ionized, generating an additional charge carrier current. Depending on the measured current, it is determined whether the battery has an insulation defect and therefore a defect.

The advantage of this method is to be able to detect very small defects or openings in an electrically-insulating material. In addition, because the measured currents are low and also limited, there is no creation of heat or risks of electrification of the operator handling the device according to the invention.

SUMMARY

The tested parts may have an impedance comprised between 5 megohms (MΩ) and 5 gigohms (GΩ) (5 megohms corresponding to a short-circuit resistance of the device). The significant variation in impedance is related in particular to the presence or absence of a defect in the dielectric material of the tested part.

In addition, depending on the distances between the electrodes and the part to be tested, the surrounding environment, etc., it might be necessary to make the value of the test voltage that supplies the injection electrode vary between a few volts and one thousand volts. Thus, considering the possible applications and the type of parts to be tested, the value of the current to be measured to determine the state of the part can therefore vary from a few nanoamperes to a few milliamperes.

Thus, the values of the currents to be measured are very low and can vary by a factor of about $10^5$. This results in the need for having a stable and low-noise electrical power supply. Indeed, the power supply must be able to deliver a constant and variable test voltage despite a variation in the load and/or the impedance related to the tested part. Hence, it is necessary that the servo-control enabling the regulation of the voltage is also stable. In addition, the power supply must be low in noise, indeed, the noise at the test voltage affects the quality of the measurement related to the current and therefore the detection of defects on the tested part. Moreover, if the noise is kept at an acceptable level, this avoids additional signal processing on the current measurement. These noise and stability constraints are also accompanied by the fact that the electrical power supply must be variable, compact, robust, and inexpensive to manufacture.

Thus, the invention aims to overcome at least one of the aforementioned drawbacks and relates to a leak detection device that includes at least two electrodes, a space intended to receive the part to be tested, a direct-current electrical power supply supplying at least one of said electrodes, and a current detector configured to measure the current flowing through the part to be tested when the latter is exposed to a voltage difference. Said electrical power supply is a variable power supply including a transformer having a midpoint primary, a transistor connected to said midpoint of said transformer, switches whose succession of openings and closures has at least one duty cycle α and enables the transmission of energy through the transformer, and at least one regulation circuit regulating the value of the duty cycle α and the voltage supplying the base of the transistor.

Said device according to the invention has the advantage of being compact and inexpensive, in particular through the use of a transformer with a midpoint and a system enabling the generation of a direct voltage featuring little noise and that adapts, thanks to the regulation circuits, to the variations of impedances of the objects tested by the device according to the invention. Thus, the device according to the invention comprises a power supply having a high stability criterion and low noise, insensitive to load variations for a wide variation in the value of the test voltage.

According to a possible feature, said electrical power supply comprises a first regulation circuit that regulates the supply of the base of said transistor and a second regulation circuit that regulates the value of the duty cycle α. In particular, the regulation of the duty cycle α and of the power supply to the base of the transistor is a function of a reference voltage $V_{ref}$ and/or of the test voltage $V_S$ applied to at least one of the electrodes and/or of the value of the load (or the value of the impedance to be tested). More particularly, the regulations of each of the first and second circuits allow $10^2$ and $10^3$ dynamics respectively (by dynamics, it should be understood the interval between the maximum and the minimum of the considered physical quantity)

Thus, it is particularly advantageous to use a transformer with a midpoint at the primary and to reconstitute a sinewave, because this is more economical and more compact than a sinewave generator or another type of transformer. More particularly, this architecture has better energy efficiency, in particular for the pursued powers, than an oscillator associated with a linear amplifier. This also allows having radiators with a smaller size (thus dissipating less energy). In addition, the device according to the invention enables the use of a non-ideal electrical source, therefore the device is particularly suitable for industrial use.

According to another possible feature, said second circuit regulates the value of the duty cycle according to a reference voltage, the output voltage $V_S$, and a modulation signal having a frequency $f_{osc}$.

According to another possible feature, the second regulation circuit comprises a circuit for controlling opening and closure of said switches.

According to another possible feature, said transformer is a step-up voltage transformer.

According to another possible feature, said device comprises a rectifying and filtering circuit configured to rectify an alternating-current signal derived from the secondary of the transformer before said signal is applied to at least one electrode.

According to another possible feature, said device further comprises a compensation circuit configured to compensate the value of the voltage actually delivered at the output by the transformer when the impedance of said part to be tested varies. At least one input of said compensation circuit is placed at the output of said rectifying and filtering circuit.

The invention also relates to a direct-current electrical power supply for a leak detection device according to one of the preceding embodiments.

According to a possible feature of at least one embodiment, the electrical power supply includes a transformer having a midpoint primary, a transistor connected to the midpoint of the primary of said transformer, switches whose succession of openings and closures has at least one duty cycle α and enables the transmission of energy through the transformer, and at least one regulation circuit regulating the value of the duty cycle α and the voltage supplying the base of said transistor.

According to a possible feature of at least one embodiment, the electrical power supply comprises a resistor, disposed between the transistor and the midpoint of the primary of the transformer.

According to a possible feature of at least one embodiment, the electrical power supply comprises, at the secondary of the transformer, a rectifying and filtering circuit configured to rectify and filter the alternating-current signal at the secondary of the transformer, before this signal supplies the injection electrode.

According to a possible feature of at least one embodiment, the electrical power supply comprises a short-circuit resistor, to limit the current at the injection electrode.

BRIEF DESCRIPTION OF THE DRAWING

The invention will be better understood, and other aims, details, features and advantages thereof will appear more clearly through the following description of particular embodiments of the invention, given only for illustration and without limitation, with reference to the appended drawings.

DETAILED DESCRIPTION

Figure 1:
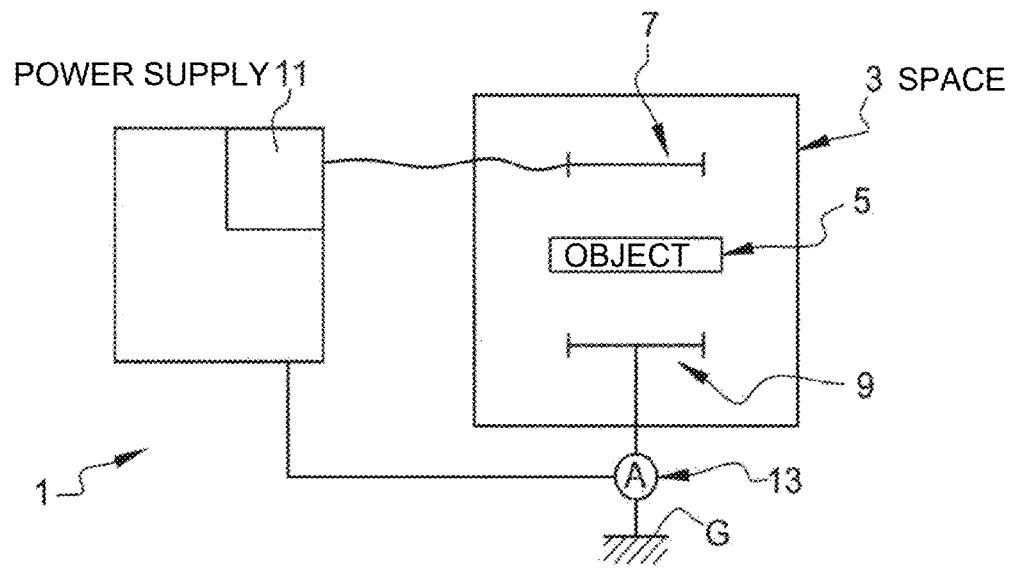
FIG. 1 is a simplified schematic representation of a leak detection device according to an embodiment of the invention.
Figure 2:
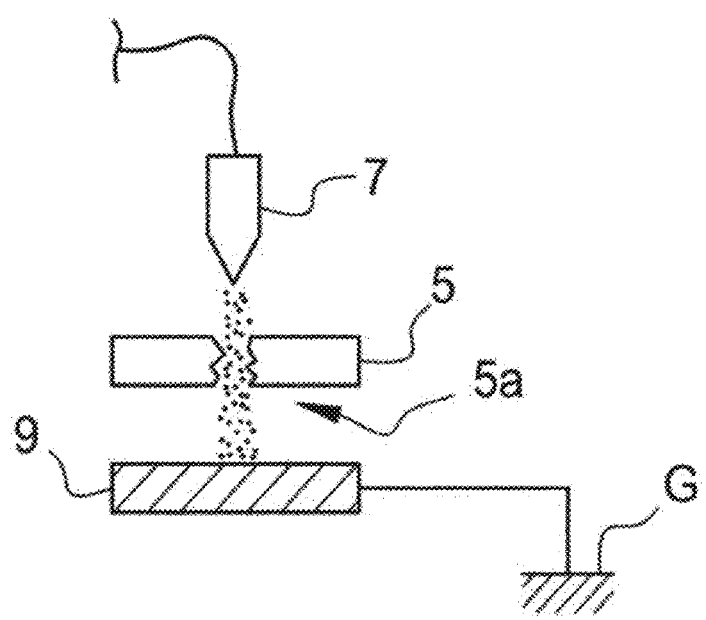
FIG. 2 is a simplified schematic representation of the electrodes of the device of FIG. 1 during testing of a part.

FIG. 1 is a simplified schematic representation of a leak detection device 1 according to an embodiment of the invention. The leak detection device 1 includes a space 3 intended to receive the part to be tested 5, two electrodes 7 and 9, a direct-current electrical power supply 11 supplying at least one of said electrodes 7, the electrode supplied by said power supply 11 being called the injection electrode, and a current measuring device 13, such as a transimpedance op-amp type ammeter, configured to measure the current flowing through the part to be tested 5 when the latter is exposed to a voltage difference.

Figure 3:
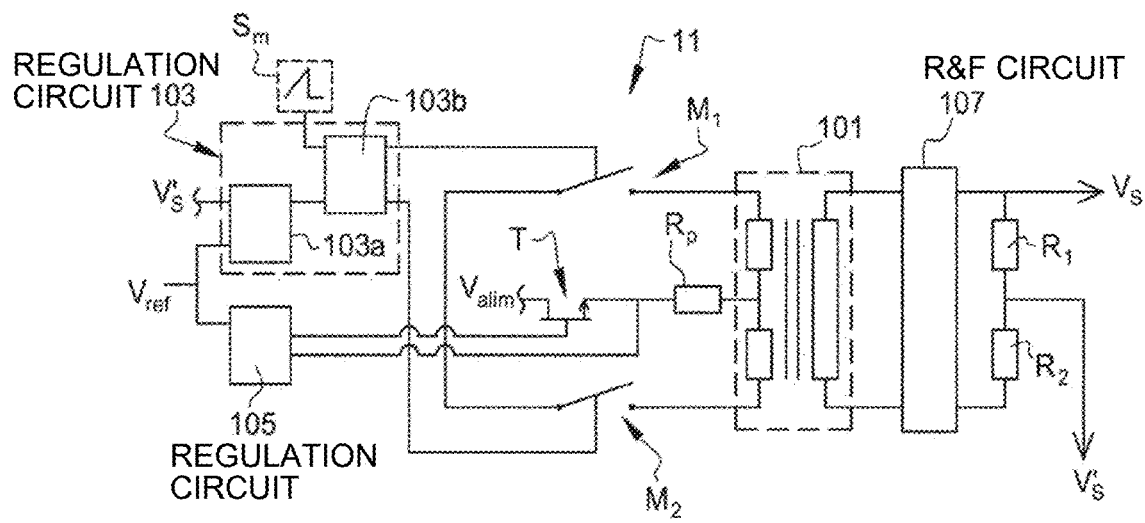
FIG. 3 is a simplified schematic representation of an electrical power supply of the device of FIG. 1.

More particularly, said electrical power supply 11, represented in particular in FIG. 3 includes a transformer 101 having a midpoint primary, a transistor T connected to the midpoint of the primary of said transformer 101, switches M1 and M2 whose succession of openings and closures has at least a duty cycle α and enables the transmission of energy through the transformer 101, and at least one regulation circuit 105 and 103 regulating the value of the duty cycle α and the voltage supplying the base of said transistor T.

It should be noted that, as illustrated in FIG. 3, the power supply 11 may also comprise a resistor $R_P$ disposed between the transistor T and the midpoint of the primary of the transformer 101. This may have the effect of limiting the intensity of the electric current at the primary.

Figure 7:
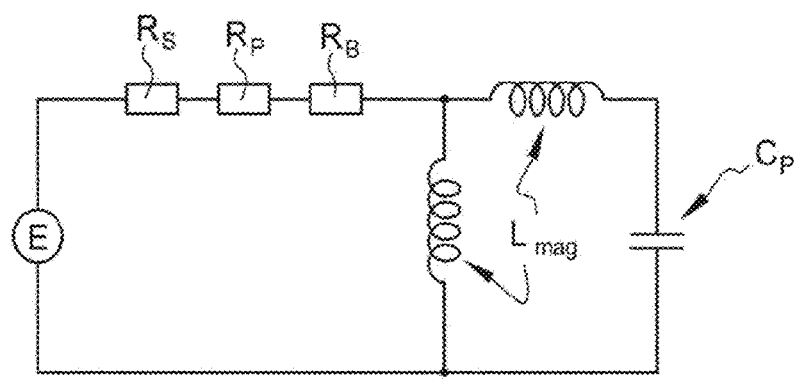
FIG. 7 is a simplified equivalent circuit of the transformer of the power supply of FIG. 3.

It should also be noted that, as illustrated in the detailed embodiment, the power supply 11 may comprise, at the secondary of the transformer 101, a rectifying and filtering circuit 107 configured to rectify and filter the alternating-current signal at the secondary of the transformer 101, before this signal supplies the injection electrode 7. Said power supply 11 may also comprise a resistor $R_S$ (illustrated in particular in FIG. 7), called a short-circuit resistor, to limit the current at the injection electrode.

Figure 3A:
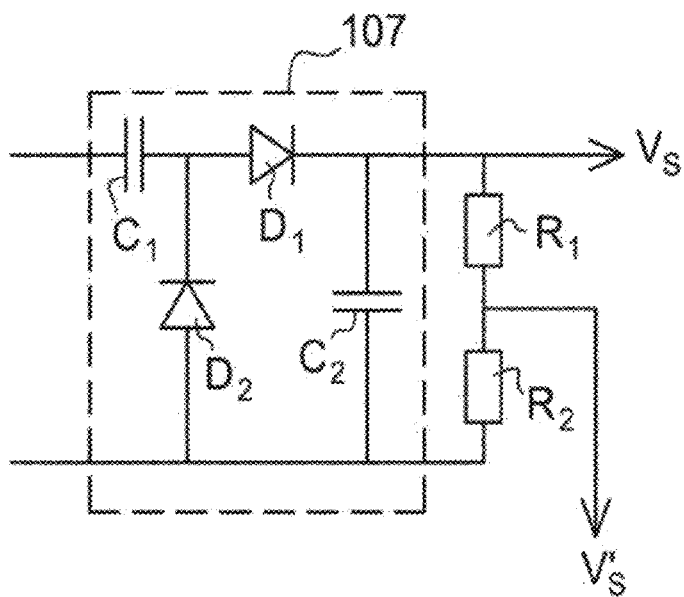
FIG. 3A is a detailed schematic view of a rectifying and filtering circuit according to an embodiment of the invention.

The rectifying and filtering circuit 107, illustrated more particularly in FIG. 3A, herein comprises two diodes $D_1$ and $D_2$, as well as two capacitors $C_1$ and $C_2$ disposed so as to form a Schenkel type voltage doubler. This mounting type allows both rectifying and filtering the alternating voltage present at the secondary of the transformer T.

Said power supply 11 may also comprise a voltage divider bridge arranged at the output of the rectifying and filtering circuit 107. This mounting type allows for example obtaining an image of the test voltage $V_S$, this image voltage being referenced $V'_S$ hereinafter and illustrated for example in FIGS. 3A and 4.

More particularly, the divider bridge comprises two resistors $R_1$ and $R_2$. The voltage at the terminals of the resistor $R_2$ is the image voltage $V'_S$. This image voltage $V'_S$ is related to the load voltage $V_S$ according to the following formula:

$$V'_S = \frac{R_2}{R_1 + R_2} V_S = k V_S,$$

with k therefore being a factor depending on the resistors $R_1$ and $R_2$.

More particularly, said at least one regulation circuit 105 and 103 has at the input a reference voltage or reference voltage $V_{ref}$, the value of the reference voltage $V_{ref}$ being proportional to the test voltage value $V_S$ that should be obtained at the output, the image voltage $V'_S$, which is an image of the output voltage $V_S$, this image voltage $V'_S$ being obtained for example by means of a divider bridge, and a modulation signal $S_M$ that determines the variation of the duty cycle α. Thus, said power supply 11 comprises a first regulation circuit 105 that regulates the supply of the base of said transistor T and a second regulation circuit 103 that regulates the value of the duty cycle α. In particular, the regulation of the duty cycle α is carried out according to the values of the reference voltage $V_{ref}$, of the load voltage $V_S$ (indirectly via the image voltage $V'_S$ of the voltage $V_S$) and of the modulation signal $S_M$.

Figure 5:
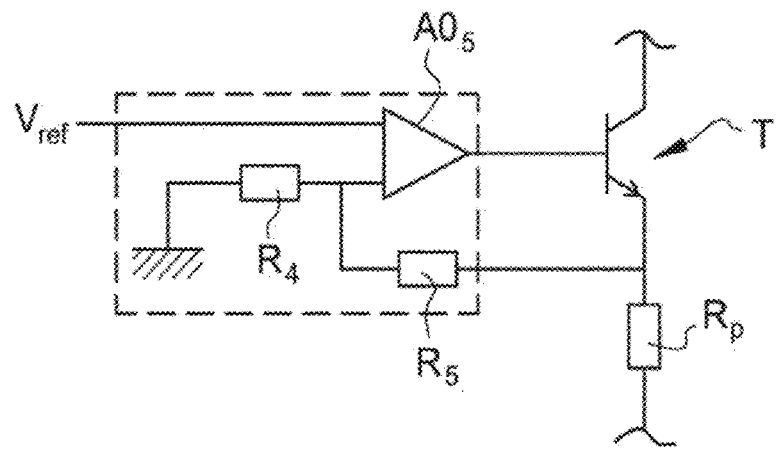
FIG. 5 is a detailed view of the first regulation circuit of the power supply of FIG. 3.

The first regulation circuit 105, illustrated more particularly in FIG. 5, comprises an operational amplifier $AO_5$ associated with two resistors $R_4$ and $R_5$ mounted as a non-inverting amplifier receiving the reference voltage $V_{ref}$ at the input (for example the values of the resistors $R_4$ and $R_5$ are equal).

The first regulation circuit 105 is configured to regulate the injection voltage $V_S$ at the injection electrode 7. Regulation by the first circuit 105 is predominant when not loaded, i.e., said circuit 105 via the transistor T is predominant in setting the value of the injection voltage when not loaded.

Thus, the transistor T is supplied at the collector with a direct voltage $V_{alim}$ and is connected at its base to the output of the first regulation circuit 105. According to the voltage $V_{AO5}$ derived from said first circuit 105, this arrangement allows the voltage at the primary of the transformer 101 to vary.

The emitter of the transistor delivers a voltage value that lies between the value of k $V_{ref}$ and zero (where k is equal to 1+$R_5$/$R_4$), this value being regulated according to the reference voltage $V_{ref}$.

The regulation circuit 105 according to the variation of the reference voltage $V_{ref}$ allows regulating the voltage on the midpoint of the primary and consequently obtaining the desired voltage at the secondary, and therefore the output voltage $V_S$ too.

More particularly, the regulation of the voltage delivered by the transistor T thus allows servo-controlling the test voltage to the reference voltage requested by the operator, whereas the second regulation circuit 103 comes into action to compensate for the test voltage and maintain the test voltage in case of a load variation (i.e., a variation in the insulation resistance of the tested part). Each of the regulation circuits 105 and 103 functions as a servo that allows for a much finer regulation over a wide range of values of the test voltage $V_S$.

Figure 4:
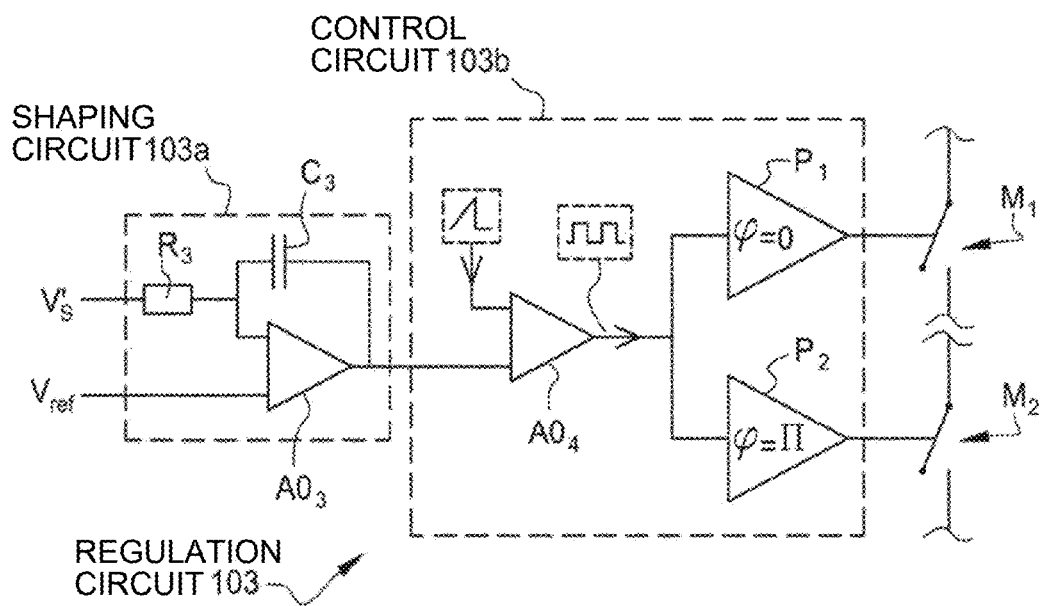
FIG. 4 is a detailed view of the second regulation circuit of the power supply of FIG. 3.

The second regulation circuit 103, illustrated more particularly in FIG. 4, includes a shaping circuit 103a comprising an operational amplifier $AO_3$, mounted as a comparator-integrator, associated with a capacitor $C_3$ and a resistor $R_3$. The second regulation circuit also includes a control circuit 103b, which has as input the output of the operational amplifier $AO_3$, as well as the modulation signal $S_m$ of the voltage $V_{osc}$ and of the frequency $f_{osc}$. The control circuit 103b is configured to generate a Pulse Width Modulation (PWM) signal with a duty cycle α, which controls opening and closure of the switches M1 and M2.

Thus, the operational amplifier $AO_3$ receives at the input the image voltage $V'_S$ and the reference voltage $V_{ref}$ and delivers at the output a resulting voltage $V_{AO3}$ in the form $\int(V_{ref}-V_S')dt$.

In turn, said control circuit 103b (seen more particularly in FIG. 4) includes an operational amplifier $AO_4$ mounted as a comparator, whose inputs receive the modulating signal $S_M$ with the frequency $f_{osc}$ and the output signal $V_{AO3}$ of the operational amplifier $AO_3$, and two logic gates $P_1$ and $P_2$, phase-shifted by π with respect to each other, so that the closure and opening of said switches M1 and M2 are carried out in phase opposition.

More particularly, the operational amplifier $AO_4$ thus compares the output voltage $V_{AO3}$ of the shaping circuit 103a with the voltage $V_{osc}$ of the modulating signal $S_M$ (for example of the ramp or sawtooth type). The frequency $f_{osc}$ of the modulator is a fixed value corresponding substantially to the resonance frequency of the electrical power supply 11 (i.e., of the inductance of the primary as well as the capacitances present at the secondary brought back to the primary).

Figure 6:
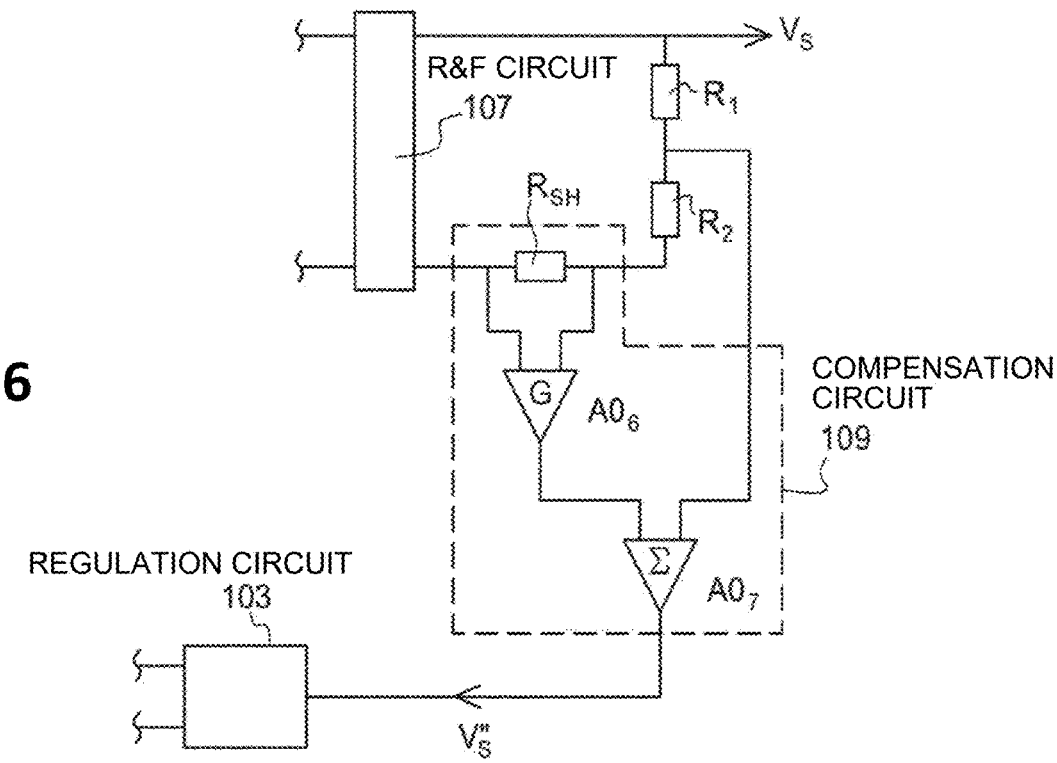
FIG. 6 is a schematic and detailed view of a variant embodiment of the circuit of FIG. 1.

It should be noted that in a variant partially represented in FIG. 6, the image voltage $V'_S$ is not derived solely and directly from a voltage divider bridge as explained before. More particularly, as illustrated in this FIG. 6, in addition to the resistors $R_1$ and $R_2$ of the divider bridge, there is a shunt resistor $R_{SH}$ disposed between the rectifying and filtering circuit 107 and the resistor $R_2$. Thus, the power supply 11 comprises a load variation compensation circuit 109, having as inputs the terminals of the shunt resistor $R_{SH}$, as well as the output voltage $V_S$' of the divider bridge formed by the resistors $R_1$ and $R_2$. Thus, when the impedance of the tested object varies, for example decreases, the efficiency of the transformer decreases, said compensation circuit 109 then allows compensating for the value of the voltage actually delivered at the output by the transformer. Thus, it is possible to increase the measurement dynamics while keeping the same current measurement accuracy.

Thus, said compensation circuit 109 includes a first operational amplifier $AO_6$ whose inputs are connected to the terminals of the shunt resistor $R_{SH}$ to which a predetermined gain G is applied. There is therefore a voltage at the output of the op-amp $AO_6$ that is related to the value of the current flowing in the secondary of the transformer 101. Said compensation circuit 109 also includes a second operational amplifier $AO_7$ that adds the values of the voltages derived from the divider bridge and the op-amp $AO_6$.

Hence, at the output of the circuit 109, an image of the voltage denoted $V''_S$ is obtained compensated for the voltage drops of the secondary, said image of the voltage $V''_S$ is then used the input value of the second regulation circuit 103.

Moreover, the selection of the frequency $f_{osc}$ of closure and opening of the switches $M_1$ and $M_2$ in phase opposition allows reconstituting a sinusoidal signal at the secondary of the transformer 101. In particular, this allows maximising the transfer of energy through the transformer 101 by limiting the generation of noises on the current delivered by the secondary of the transformer 101.

Indeed, a power supply portion of FIG. 3 can be modelled in the form of a simplified equivalent circuit. This simplified equivalent circuit is illustrated more particularly in FIG. 7. Thus, seen from the primary, the circuit can be considered as an RLC circuit including a voltage source E, resistors $R_S$, $R_B$, $R_P$ corresponding respectively to the internal resistance (and to the short-circuit resistance) of the generator, to the resistance of the winding of the primary, and to the resistance connected to the midpoint of the transformer 101, an inductance $L_{MAG}$ corresponding to the magnetising inductance of the primary, and a capacitance CP corresponding to the capacitance present at the terminals of the set of the two primaries. It should be noted that the resistance of the transistor allows obtaining the equivalent of a variable voltage regulator.

In the present case, the resistance of the primary winding can be neglected in comparison with the value of the other resistances.

Thus, the natural pulsation $\omega_0$ of such an RLC circuit is as follows:

$$\omega_0 = \frac{1}{\sqrt{L_{MAG}C_P}}$$

In the same manner, one can determine a reduced damping coefficient m as follows:

$$m = \frac{R_s + R_P}{2}\sqrt{\frac{C_P}{L_{MAG}}}$$

Thus, in pseudo-periodic mode, it is possible to define a pseudo-pulsation cop such that:

$$\omega_P = \omega_0\sqrt{1-m^2}$$

However, when the frequency of the modulator $f_{osc}$ is equal (or substantially equal) to the frequency of the equivalent circuit, more particularly in sustained subcritical mode, m is well below 1 and $\omega \approx \omega_0$.

The voltage $U_M$ delivered by the transformer is then in the form $U_M \approx \alpha E$, where $\alpha$ is the duty cycle of the first regulation circuit 103, and $\lambda$ is a coefficient depending on the transfer function of the PWM control circuit.

Figure 8:
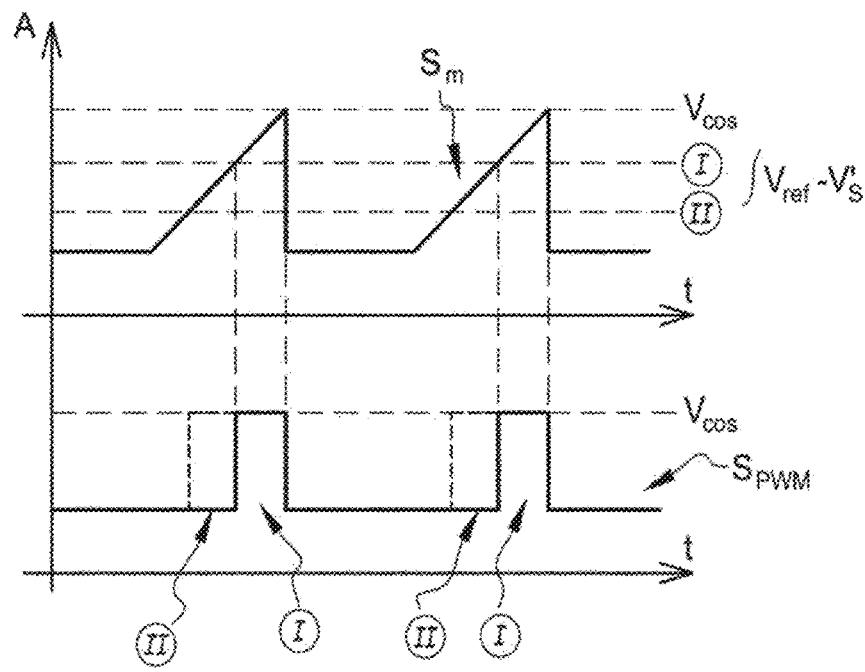
FIG. 8 represents examples of signals specific to the regulation circuit of FIG. 3.

Thus, as illustrated in FIG. 8, the shaping circuit 103a integrates the difference between the image voltage $V'_S$ and the reference voltage $V_{ref}$, and therefore outputs a direct voltage $V_{AO3}$. Thus, this voltage $V_{AO3}$ is compared with the modulating voltage $V_{osc}$, and allows generation of a square signal $S_{PWM}$. The duty cycle $\alpha$ of said square signal is modified according to the variation of the load current. More particularly, if the reference voltage $V_{ref}$ increases, then the voltage $V_{AO3}$ decreases, and the duty cycle $\alpha$ of the resulting square signal $S_{PWM}$ increases. Indeed, when the value of the resistance (or of the load) of the tested part decreases, then the duty cycle $\alpha$ increases to preserve the test voltage.

Hence, the square signal $S_{PWM}$ is the output signal of the control circuit 103b that controls opening and closure of the switches $M_1$ and $M_2$. The square signal $S_{PWM}$ has a constant frequency $f_{osc}$. Hence, the opening and closure of the switches M1 and M2 supplies alternately, with a phase shift of $\pi$, each of the portions of the primary of the transformer 101.

Figure 9:
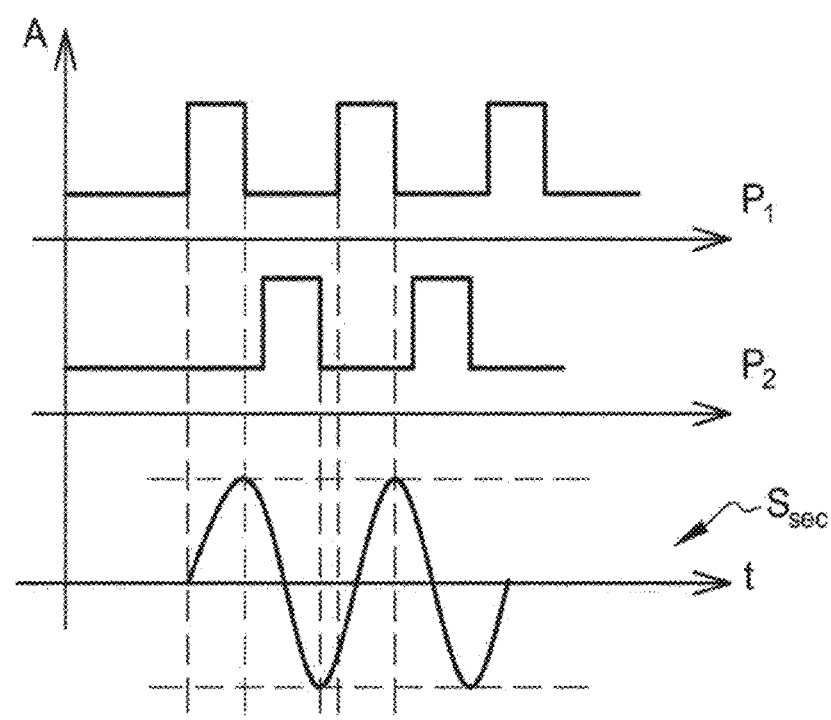
FIG. 9 represents the signals received by the switches of the power supply of FIG. 3 and the output signal at the secondary of the transformer.

As represented in FIG. 9, each of the closures and openings of said switches $M_1$ and $M_2$ thus allows reconstituting the fundamental of a square signal, i.e., by definition, the signal $S_{sec}$ generated by a parallel resonance oscillator is operating in a forced underdamped mode. Thus, the modification of the duty cycle $\alpha$ allows acting on the amount of transferred energy and therefore on the value of the voltage of the alternating signal $S_{sec}$ at the secondary of the transformer 101.

The invention claimed is:

1. A leak detection device, said device comprising:
    a space intended to receive a part to be tested;
    at least two electrodes disposed on either side of said space;
    a direct-current electrical power supply supplying at least one of said electrodes with an output voltage; and
    a current detector configured to measure current generated by a voltage difference between said electrodes, wherein said electrical power supply is a power supply comprising:
    a transformer having a primary with a midpoint;
    a transistor connected to said midpoint of said transformer;
    switches whose succession of openings and closures has a duty cycle and enables a transmission of energy through the transformer; and
    at least one regulation circuit regulating a value of the duty cycle and a voltage supplying a base of said transistor.

2. The leak detection device according to claim 1, wherein the at least one regulation circuit of said electrical power supply comprises:
    a first regulation circuit that regulates a power supply of the base of said transistor; and
    a second regulation circuit that regulates the duty cycle.

3. The leak detection device according to claim 2, wherein said second circuit regulates the value of the duty cycle according to a reference voltage, the output voltage, and a modulation signal having a frequency.

4. The device according to claim 3, wherein a frequency of opening and closure of the switches is constant.

5. The device according to claim 3, wherein a frequency of opening and closure of the switches has a value setting the first regulation circuit and the second regulation circuit in an underdamped mode.

6. The leak detection device according to claim 2, wherein a frequency of opening and closure of the switches is constant.

7. The device according to claim 6, wherein the frequency of opening and closure of the switches has a value setting the first regulation circuit and the second regulation circuit in an underdamped mode.

8. The leak detection device according to claim 1, wherein a first regulation circuit of the at least one regulation circuit regulates a voltage delivered by the transistor to the primary of the transformer according to a reference voltage.

9. The device according to claim 8, wherein a frequency of opening and closure of the switches is constant.

10. The leak detection device according to claim 2, wherein a frequency of opening and closure of the switches has a value setting the first regulation circuit and the second regulation circuit in an underdamped mode.

11. The leak detection device according to claim 10, wherein the second regulation circuit comprises:
   a shaping circuit for shaping values of a reference voltage and of the output voltage; and
   a control circuit for controlling the opening and closure of the switches.

12. The leak detection device according to claim 11, wherein said transformer is a step-up voltage transformer.

13. The device according to claim 2, wherein the first regulation circuit regulates a voltage delivered by the transistor to the primary of the transformer according to a reference voltage.

14. The leak detection device according to claim 1, wherein the electrical power supply comprises a rectifying and filtering circuit configured to rectify an alternating-current signal derived from a secondary of the transformer before said signal is applied to at least one of the electrodes.

15. The leak detection device according to claim 14, wherein the electrical power supply further comprises a compensation circuit configured to compensate a value of a voltage actually delivered at an output by the transformer when an impedance of said part to be tested varies, at least one input of said compensation circuit being placed at an output of said rectifying and filtering circuit.

16. A direct-current electrical power supply for a leak detection device, the leak detection device comprising:
   a space intended to receive a part to be tested;
   at least two electrodes disposed on either side of said space; and
   a current detector configured to measure current generated by a voltage difference between said electrodes, wherein the direct-current electrical power supply supplies at least one of said electrodes with an output voltage, and the direct-current electrical power supply comprises:
   a transformer having a primary with a midpoint;
   a transistor connected to the midpoint of the primary of said transformer;
   switches whose succession of openings and closures has a duty cycle and enables transmission of energy through the transformer; and
   at least one regulation circuit regulating a value of the duty cycle and a voltage supplying a base of said transistor.

17. The direct-current electrical power supply according to claim 16, comprising a resistor disposed between the transistor and the midpoint of the primary of the transformer.

18. The direct-current electrical power supply according to claim 17, comprising, at a secondary of the transformer, a rectifying and filtering circuit configured to rectify and filter an alternating-current signal at a secondary of the transformer, before said signal supplies an injection electrode of the at least two electrodes.

19. The direct-current electrical power supply according to claim 16, comprising a short-circuit resistor to limit current at an injection electrode of the at least two electrodes.

* * * * *